(12) United States Patent
Sakai et al.

(10) Patent No.: US 8,097,115 B2
(45) Date of Patent: Jan. 17, 2012

(54) MANUFACTURING METHOD OF ELECTRO OPTICAL DEVICE

(75) Inventors: Toshiyuki Sakai, Chitose (JP); Yuji Sekiguchi, Chitose (JP)

(73) Assignee: Seiko Epson Corporation, Tokyo (JP)

( * ) Notice: Subject to any disclaimer, the term of this patent is extended or adjusted under 35 U.S.C. 154(b) by 406 days.

(21) Appl. No.: 12/112,724

(22) Filed: Apr. 30, 2008

(65) Prior Publication Data

US 2008/0308216 A1 Dec. 18, 2008

(30) Foreign Application Priority Data

Jun. 15, 2007 (JP) .................................. 2007-158354

(51) Int. Cl.
*B29C 65/00* (2006.01)
*B32B 37/00* (2006.01)

(52) U.S. Cl. ............................ 156/290; 156/99; 156/277

(58) Field of Classification Search .................. 349/153, 349/154, 155, 156, 190; 156/145, 277, 291, 156/292, 99

See application file for complete search history.

(56) References Cited

U.S. PATENT DOCUMENTS

| 4,787,332 A | * | 11/1988 | Geisel et al. | .................. 118/692 |
| 5,054,650 A | * | 10/1991 | Price | ................................. 222/1 |
| 2006/0141131 A1 | * | 6/2006 | Murakami | ...................... 427/58 |

FOREIGN PATENT DOCUMENTS

| EP | 1600809 A1 | * | 11/2005 |
| JP | 2003-222883 | | 8/2003 |
| JP | 2006-181418 | | 7/2006 |
| JP | 2006-267559 | | 10/2006 |
| JP | 2006-350052 | | 12/2006 |

* cited by examiner

*Primary Examiner* — John Goff
(74) *Attorney, Agent, or Firm* — AdvantEdge Law Group, LLC (57) ABSTRACT

A manufacturing method of an electro optical device includes drawing a seal material in adjacent substrate forming areas on a first large size substrate and bonding a second large size substrate to the first large size substrate via the seal material. During drawing of the seal material, the seal material is continuously drawn in the substrate forming areas by a going stroke, a return point, and a returning stroke. In the going stroke, the seal material is continuously drawn through a portion of each of the substrate forming areas to the return point. In the returning stroke, the seal material is continuously drawn from the return point and through a different portion of each of the substrate forming areas.

5 Claims, 8 Drawing Sheets

MANUFACTURING METHOD OF ELECTRO OPTICAL DEVICE

BACKGROUND

1. Technical Field

The present invention relates to a manufacturing method of an electro optical device in which a seal material is continuously drawn on a first large size substrate having a plurality of substrate forming areas.

2. Related Art

A liquid crystal device generally has a structure in which a pair of opposing substrates are bonded through a seal material at the periphery of each of the substrates and liquid crystal is enclosed in the space surrounded by the pair of substrates and the seal material. There has been known a liquid crystal injection method in which liquid crystal is injected in the space formed between the both substrates and the seal material by using a vacuum injection method or the like after the two substrates are bonded together through a seal material. Further, in recent years, one drop fill method (ODF) has been employed in which liquid crystal is dropped on at least one of the substrates and thereafter the other substrate is bonded thereto through a seal material so as to sandwich the liquid crystal.

In the one drop fill method, liquid crystal is dropped before a pair of substrates are bonded together, so that it is not required to form a liquid crystal injection opening in the seal material. Accordingly, in a pre process for collectively manufacturing a plurality of substrate forming areas by using large size substrates, the large size substrates can be bonded together.

Figure 11:
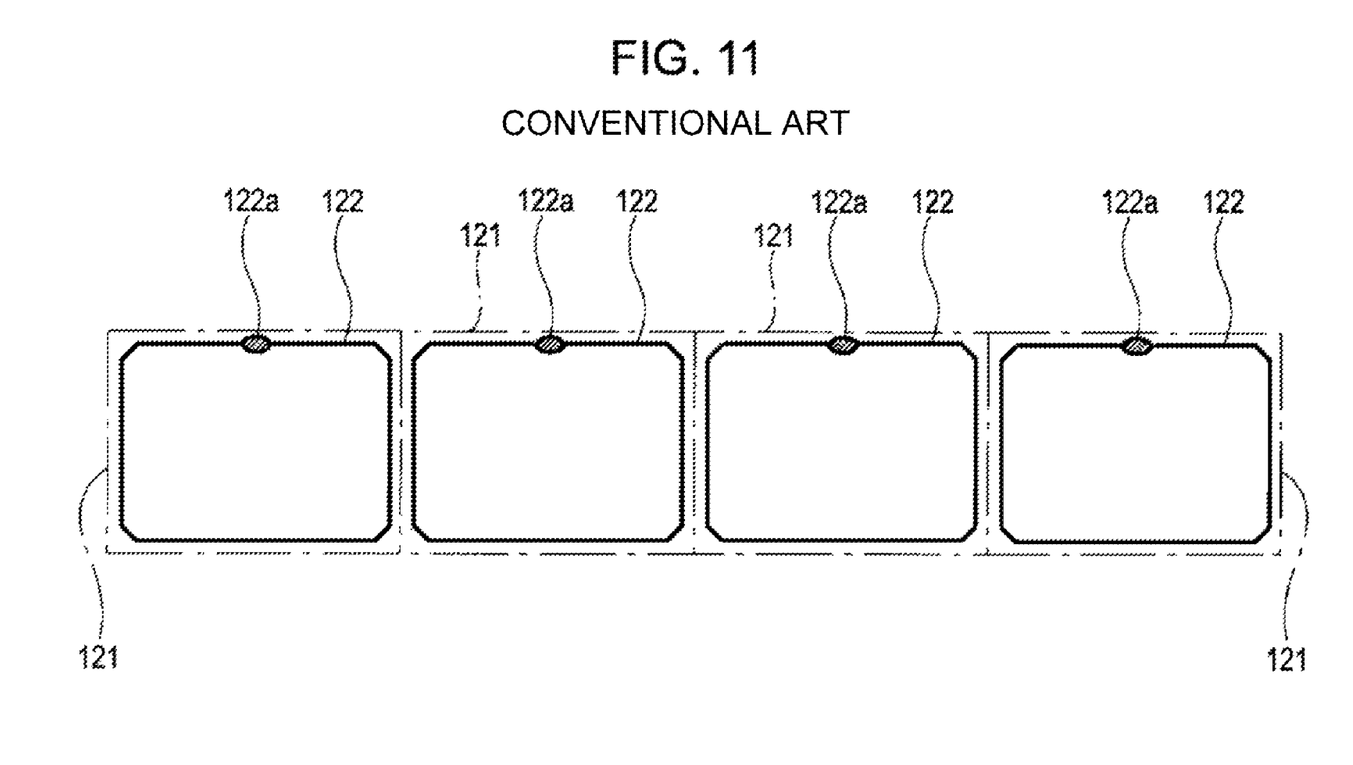
FIG. 11 is a diagram illustrating a conventional drawing pattern.

Only one row of each substrate forming area 121 formed on a large size substrate is enlargedly shown in FIG. 11. The seal material 122 is drawn in a frame manner by using a dispenser for every substrate forming area 121, and the drawing start point and the drawing end point are closed by a joint 122a.

The joint 122a is required to be certainly sealed. Shortage of application of the seal material at the joint 122a causes leakage of liquid crystal. On the other hand, excess application of the seal material at the joint 122a invites display error due to intrusion of the seal material into a viewing area. Accordingly, it is required to adjust drawing speed at the joint 122a between drawing start point and drawing end point when drawing the seal material. Accordingly, there is a problem that not only a complex labor is required, but also drawing takt time is lengthened.

Further, the seal material retained in the dispenser is ejected from a nozzle by a constant amount by application of air pressure or the like. In the state where the seal material is continuously ejected from the nozzle, the pressured air is ejected with the seal material, so that the seal material is always ejected by an approximately constant amount. However, once the ejection of the seal material is stopped, bubbles of air are retained in the dispenser, and the bubbles block the inside of the nozzle when the ejection of the seal material is restarted, thereby causing temporal ejection delay.

As a way to cope with the problem, a technique for continuously collectively forming a first pattern which becomes a part of the seal material and a second pattern which becomes a remaining part of the seal material on substrate forming areas arranged in a row or column direction among a plurality of substrate forming areas formed on a large size substrate is disclosed in, for example, JP-A-2006-181418.

According to the technique, it is not required to form a seal material for every substrate forming area. Accordingly, it is not necessary to form a joint for every substrate forming area and setup time required for setting drawing conditions is also simplified, so that operation efficiency is improved. Further, the length of the seal material continuously ejected becomes long and the number of times for stopping the ejection of the seal material is reduced by the rate, so that the occurrence of ejection error can be reduced.

However, in the technique disclosed in the above document, the seal material is drawn by two patterns of a first pattern and a second pattern for one row or column, so that it is required to temporarily stop the ejection of the seal material when switching from the first pattern to the second pattern. As a result, drawing error occurs due to ejection delay when starting ejection for the second pattern. In addition, there is a problem in that it takes a drawing takt time for individually drawing the first pattern and the second pattern.

SUMMARY

An advantage of some aspects of the invention is that it provides a manufacturing method of an electro optical device which makes it possible to provide reduction of occurrence of drawing error and substantial shortening of drawing takt time.

According to an aspect the invention, there is provided a manufacturing method of an electro optical device that includes drawing a seal material on a first large size substrate having a plurality of substrate forming areas in at least each of the substrate forming areas and bonding a second large size substrate to the first large size substrate via the seal material. The seal material is continuously drawn in a plurality of the substrate forming areas arranged so as to be adjacent to each other in accordance with a set drawing pattern by a going stroke by which the seal material is continuously drawn in a part of the substrate forming areas and by a returning stroke by which the seal material is continuously drawn to another part of the substrate forming areas, an end of the going stroke continuing to the returning stroke via a return point, when drawing the seal material.

In the structure, as the drawing of the seal material to the first large substrate having the plurality of substrate forming areas is continually formed by the going stroke and the returning stroke, occurrence of drawing error is reduced and substantial shortening of drawing takt time can be provided.

It is preferable that a drawing start point and a drawing end point of the seal material are positioned at a first side of the plurality of substrate forming areas and the return point is positioned at a second side facing the first side when drawing the seal material in the above manufacturing method of an electro optical device.

In the structure, the drawing start point and the drawing end point of the seal material are set at the first side of the plurality of substrate forming areas and the return point is to be positioned at the second side facing the first side. Accordingly, the drawing of the seal material can be easily continuously formed from the going stroke to the returning stroke.

It is also preferable that the drawing start point and the drawing end pint of the seal material are provided at adjacent positions when drawing the seal material in the above manufacturing method of an electro optical device.

In the structure, as the drawing start point and the drawing end pint of the seal material are provided at adjacent positions, it becomes easy to move for the next drawing, which makes it possible to provide further shortening of drawing takt time.

It is also preferable that a drawing speed at a corner portion is set slower than a drawing speed at a straight portion when drawing the seal material in the above manufacturing method of an electro optical device.

In the structure, as the drawing speed at a corner portion is set slower than the drawing speed at a straight portion, the seal material is hardly interrupted at a corner portion, which makes it possible to improve the quality of the products.

It is also preferable that a distance between the adjacent seal material drawn in one of the substrate forming areas and another one of the substrate forming areas adjacent to the one of the substrate forming areas is narrowly set when drawing the seal material in the above manufacturing method of an electro optical device.

In the structure, as the distance between the adjacent seal material drawn in one of the substrate forming areas and another one of the substrate forming areas adjacent to the one of the substrate forming areas is narrowly set, it is prevented that the seal material is invaded into the substrate forming area even when the two large size substrate are bonded together and the seal material is squashed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the accompanying drawings.

First Embodiment

Figure 1:
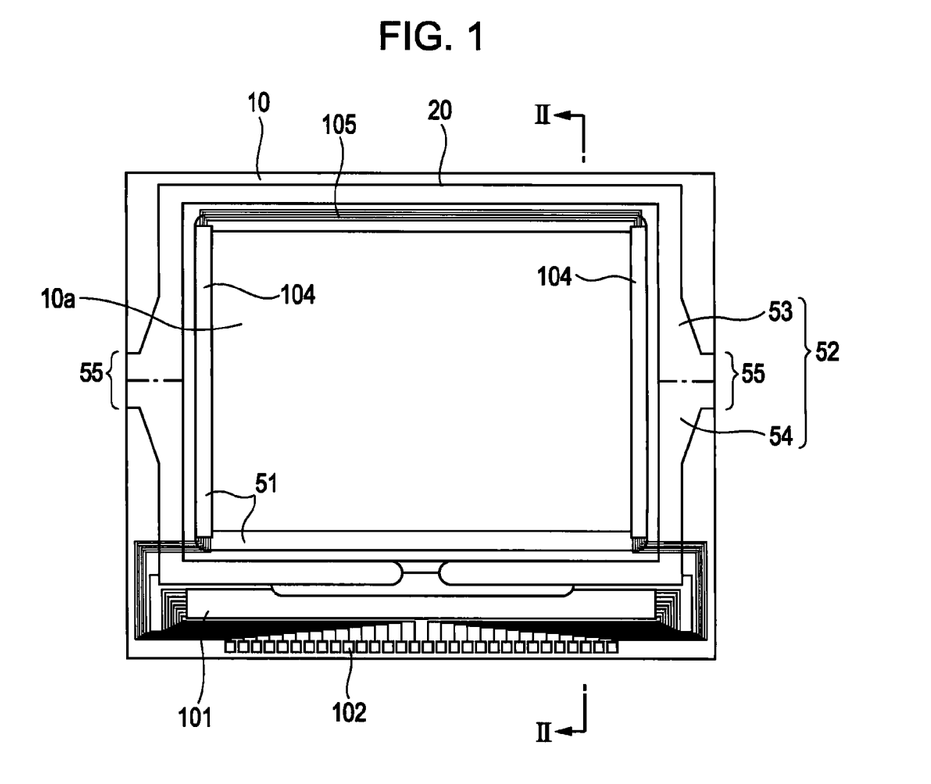
FIG. 1 is a plan view showing a liquid crystal device which is an electro optical device according to a first embodiment with each constitute element formed thereon viewed from a counter substrate side.
Figure 2:
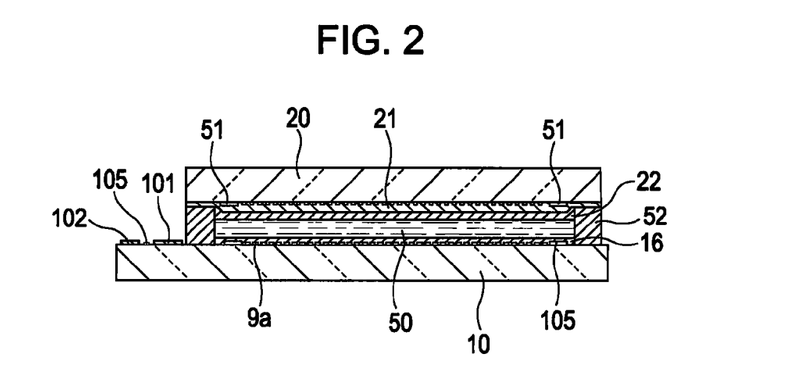
FIG. 2 is a diagram showing the liquid crystal device after an assembly process for bonding a TFT substrate and the counter substrate together and enclosing liquid crystal in the first embodiment, and is a cross sectional view taken along the line II-II of FIG. 1.

A first embodiment of the invention is shown in FIGS. 1 to 7. FIG. 1 is a plan view showing a liquid crystal device which is an electro optical device with each constitute element formed thereon viewed from a counter substrate side. FIG. 2 is a diagram showing the liquid crystal device after an assembly process for bonding a TFT substrate and the counter substrate together and enclosing of liquid crystal, and is a cross sectional view taken along the line II-II of FIG. 1.

First, the entire structure of the liquid crystal device employed in the embodiment will be described. As shown in FIGS. 1 and 2, the liquid crystal device includes a TFT substrate 10 and a counter substrate 20 oppositely disposed thereto. The substrates 10, 20 are bonded together through a seal material 52 having a rectangular shape formed by application of a seal material in a seal area provided around a viewing area 10a between the opposing surfaces of the both substrates 10, 20. Further, liquid crystal 50 which is an example of an electro-optic material is enclosed in the area surrounded by the opposing surfaces of the both substrate 10, 20 and the seal material 52. The seal material 52 is formed by an upper seal portion 53 and a lower seal portion 54 each having a U character shape. The upper seal portion 53 and the lower seal portion 54 form a vertically symmetrical shape. The both seal portions 53, 54 are bonded together to form one seal material 52.

Coupling portions 55 formed at the both ends of the both seal portions 53, 54 are projected toward the outer side of the frame. Each of the both coupling portions 55 is formed by an upper coupling portion 55a formed in an upper seal portion 53 and a lower coupling portion 55b formed in a lower seal portion 54 formed on one first large size substrate 120 which are squashed when bonding both large-size substrates 110, 120 together.

In the embodiment, shortening of drawing takt time of the seal material 52 is provided by forming the seal material 52 with a continuous drawing pattern PT. The drawing pattern PT has the upper seal portion 53 and the lower seal portion 54, and the both seal portions 53, 54 are oppositely disposed in the vertical direction (Y direction). Further, a plurality of the both seal portions 53, 54 are disposed in the row direction (X direction) via the coupling portion 55. The large size substrates 120, 110 are divided into a unit of a liquid crystal device at the center of the coupling portion 55 after the large size substrates 120, 110 are bonded together, so that the coupling portion 55 is left in the divided liquid crystal device.

Further, a periphery light shielding film 51 having light blocking effect for regulating the viewing area 10a is provided on the counter substrate 20 so as to be in parallel with the inside of the seal area in which the seal material 52 is disposed. Further, a data line driving circuit 101 and external circuit connection terminals 102 are provided along one side of the TFT substrate 10 in the out side portion of the seal area in which the seal material 52 is disposed among the periphery area spreading around the viewing area 10a, and scanning line driving circuits 104 are provided along two sides adjacent to the one side. Further, a plurality of wirings 105 for electrically connecting between the scanning lined driving circuits 104 provided at the both side of the viewing area 10a are provided at the remaining one side of the TFT substrate 10. Note that the scanning line driving circuits 104 and the wirings 105 are provided at the positions opposing the periphery light shielding film 51 inside the seal material 52.

Further, an alignment layer 16 is formed on pixel electrodes 9a on the TFT substrate 10 after TFT's for switching pixel, wirings such as a scanning line, data line, and the like are formed thereon. On the other hand, an alignment layer 22 is formed on the topmost layer on the counter substrate 20 in addition to a counter electrode 21. A predetermined alignment state is set between the pair of alignment layers 16, 22.

Next, a manufacturing method of the liquid crystal device, in particular, a seal material drawing process performed in a pre process will be described. Herein, a method referred to as "multiple production" is employed in which plurality of liquid crystal devices are collectively manufactured by using a large size substrate as the manufacturing method of the liquid crystal device. That is, in the pre process, substrate forming areas which become the TFT substrates 10 and the counter substrates 20 are formed in a matrix manner in the row direction (X direction) and the column direction (Y direction) on the second large size substrate 110 and the first large size substrate 120 in the state where the TFT substrates 10 and the counter substrates 20 are provided at predetermined positions. Note that in the following, for the sake of convenience, the TFT substrate forming area which becomes the TFT substrate 10 formed on the second large size substrate 110 is shown by reference numeral 10 and the counter substrate forming area which becomes the counter substrate 20 formed on the first large size substrate 120 is shown by reference numeral 20.

Figure 4:
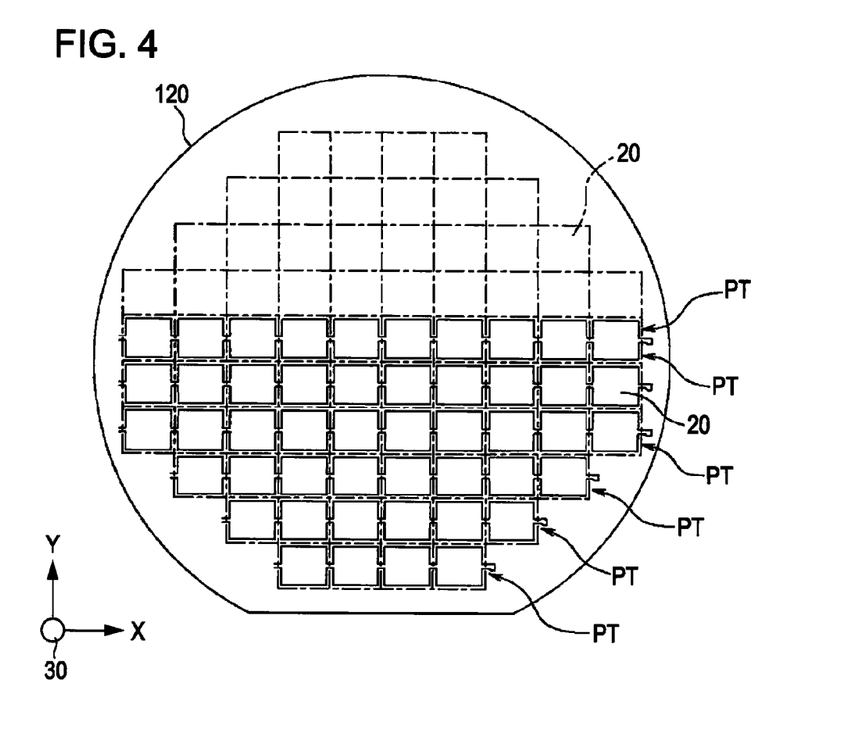
FIG. 4 is a plan view of the large size substrate in the first embodiment.

Then, in the seal material drawing process, the seal material 52 is formed on the first large size substrate 120 on which the plurality of counter substrate forming areas 20 are formed by using a dispenser 30. As shown in FIG. 4, the seal material 52 formed on the first large size substrate 120 is collectively continuously drawn (so called one stroke writing) with respect to the plurality of counter substrate forming areas 20 arranged in the row direction (X direction).

Figure 5:
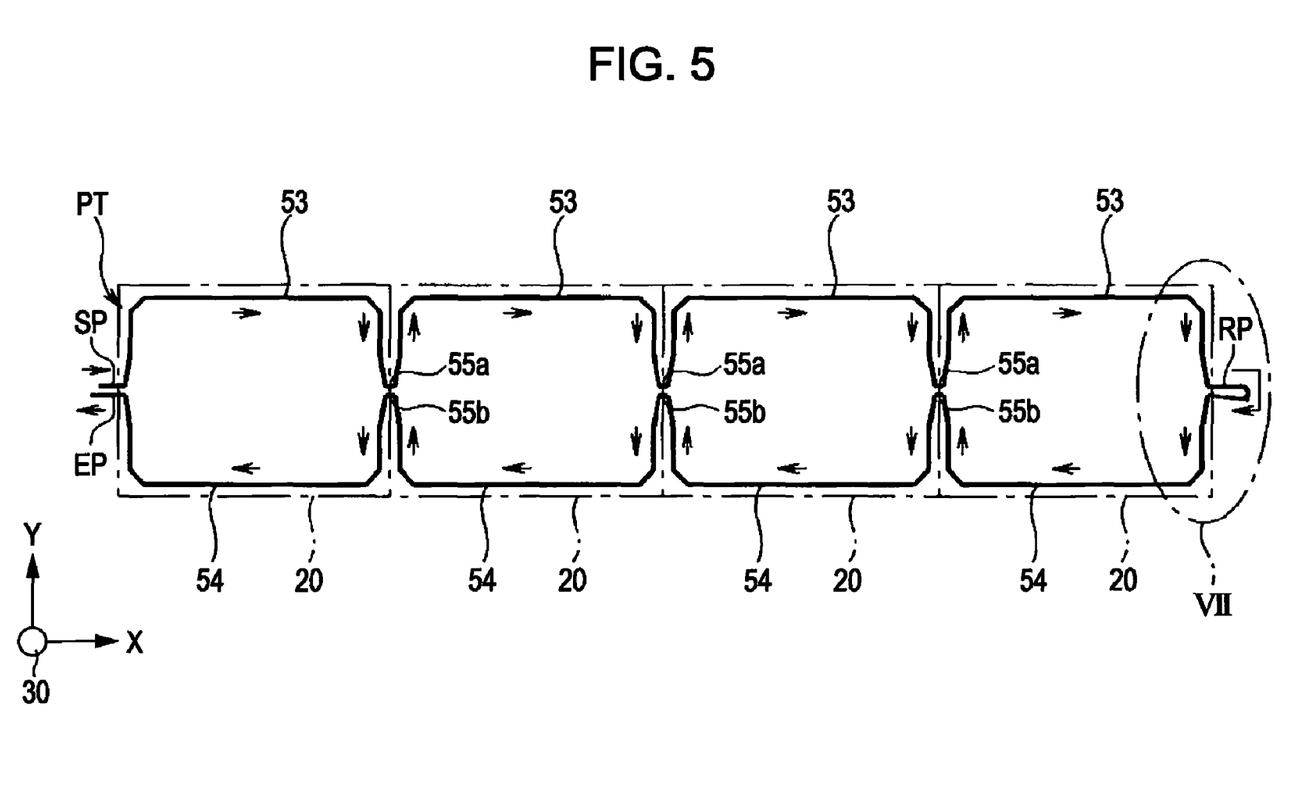
FIG. 5 is a part enlarged view of FIG. 4 in the first embodiment.

In FIG. 5, there is shown a drawing mode of the seal material 52 to the plurality of counter substrate forming areas 20 which are formed at the lowest row of the first large size substrate 120 shown in FIG. 4. Note that drawing of the seal material 52 to the plurality of counter substrate forming areas 20 formed in the other rows is also performed by the same drawing mode, so that the description is omitted.

In the embodiment, the seal material 52 formed in the plurality of counter substrate areas 20 formed in each row direction (X direction) of the first large size substrate 120 is formed by a continuous drawing pattern PT. That is, first, the upper seal portion 53 of each counter substrate forming area 20 is continuously drawn via the upper coupling portions 55a in a going stroke, and then, the lower seal portion 54 of each counter substrate forming area 20 is continuously drawn via the lower coupling portions 55b in a returning stroke.

A drawing start point SP is provided at the left end of the center of the seal material 52 in the column direction (Y direction) formed in the counter substrate forming area 20 positioned at the drawing start point side (left end in the embodiment) of the counter substrate forming areas 20 formed in each row direction (X direction) of the first large size substrate 120. The drawing start point SP has a length in consideration for the ejection delay of the seal material ejected from a nozzle of the dispenser 30. Further, a drawing end point EP which continues to the lower seal portion 54 is provided so as to be in parallel with the drawing start point SP. Note that the side which continues to the drawing start point SP and the drawing end point EP (side of the left end in FIG. 5) corresponds to the first side of the invention. Further, a return point RP is provided at the terminal end side of the counter substrate forming area 20 positioned at the return side (right end in the embodiment) of the counter substrate forming areas 20 formed in the first large size substrate 120 in each row direction (X direction). Note that the side continues to the return point RP (side of right end in FIG. 5) corresponds to the second side of the invention facing the first side.

Then, drawing of the seal material is started after the nozzle of the dispenser 30 is approached at the drawing start point SP. On this occasion, ejection delay of the seal material occurs. However, the ejection delay is eliminated when the nozzle passes through the drawing start point SP, so that the seal material is ejected from the nozzle of the dispenser 30 by a predetermined amount when the nozzle is reached at the upper coupling portion 55a in the counter substrate forming area 20 at the drawing start pint SP side.

In the going stroke, first, the upper seal portion 53 of the first counter substrate forming areas 20 is formed by the seal material ejected from the nozzle of the dispenser 30. When forming the upper seal portion 53, the dispenser 30 is relatively moved in the row direction (+X direction) to form the upper coupling portion 55a which continues to the drawing starting point SP by the seal material ejected from the nozzle of the dispenser 30. Then, a left side slope portion 56a is formed by relatively moving the dispenser 30 in an obliquely upward direction. Then, the dispenser 30 is relatively moved in the column direction (+Y direction) to form a left side portion 57a.

Then, a chamfered portion 58a is formed by relatively moving the dispenser 30 in an obliquely upward direction (about 45 degrees) in the vicinity of the upper end.

Then, an upper side portion 59a is formed by relatively moving the dispenser 30 in the row direction (+X direction). Then, when the dispenser 30 is reached at the vicinity of a right side portion 60a, the dispenser 30 is relatively moved in an obliquely downward direction (about 45 degrees) to form a chamfered portion 61a. Then, the right side portion 60 facing the left side portion 57a is formed by lowering the dispenser 30 in the column direction (−Y direction).

Then, a right side slope portion 62a facing the left side slope portion 56a is formed by relatively moving the dispenser 30 in an obliquely downward direction. Then, the upper coupling unit 55a is formed by relatively moving the dispenser 30 in the row direction (+X direction) at the vicinity of the center portion of the seal material 52 in the column direction (Y direction). Then, the dispenser 30 is relatively moved in the counter substrate forming area 20 adjacent to the left via the upper coupling portion 55a and the upper seal portion 53 is continuously formed by relative moving the dispenser 30 in the counter substrate forming area 20 (see FIG. 6A).

Figure 7:
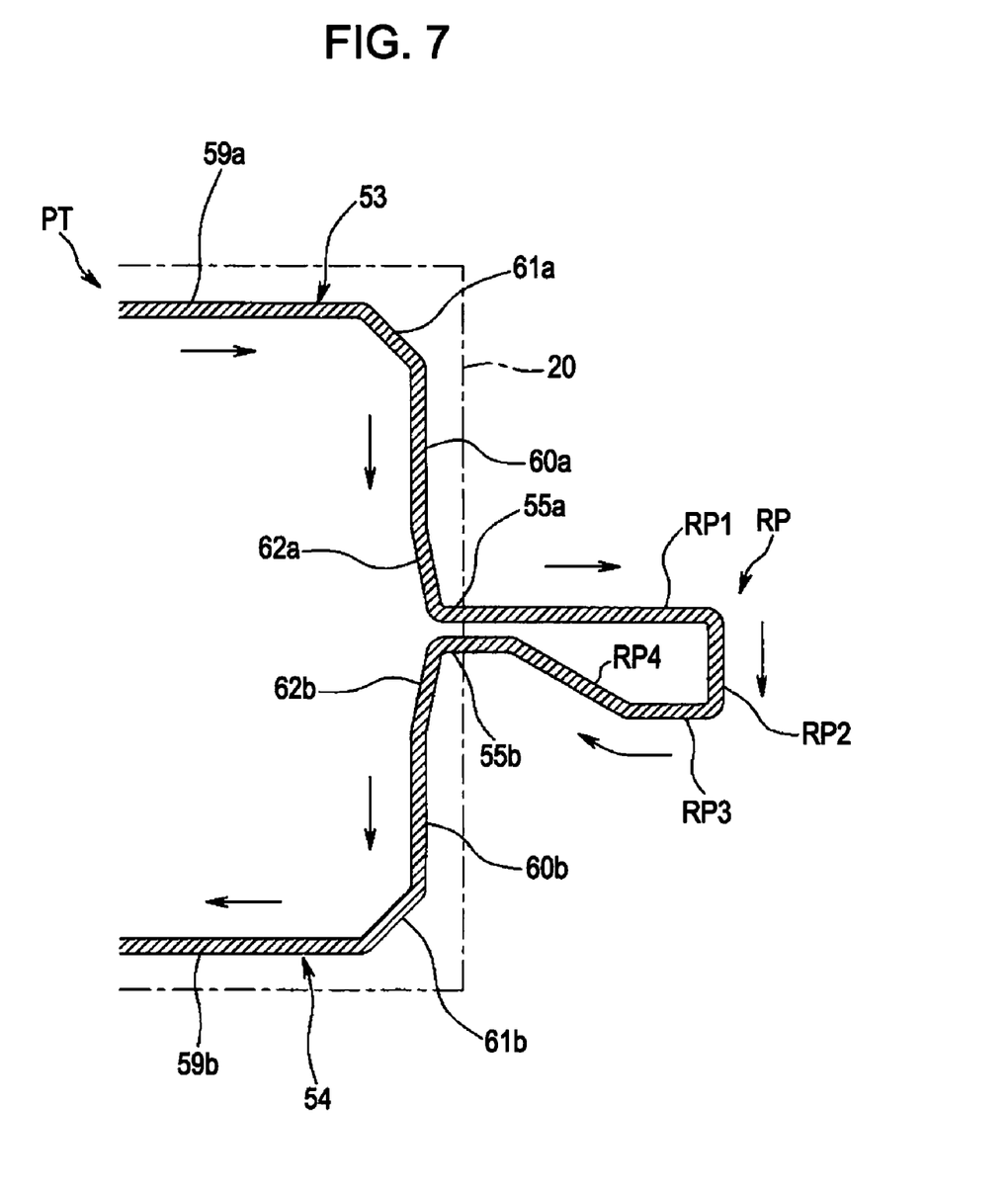
FIG. 7 is an enlarged view of the portion VII of FIG. 5.

By repeating the operation, the upper seal portion 53 is continuously formed in the counter substrate forming area 20 adjacent to the right. Then, when the formation of the upper seal portion 53 is finished with respect to the counter substrate forming area 20 positioned at the right end, as shown in FIG. 7, an upper side portion RP1 of the return point RP is formed by extending the upper coupling portion 55a without change. Then, a side portion RP2 is formed by lowering the dispenser 30 in the column direction (−Y direction), and then, a lower side portion RP3 is formed by relatively moving the dispenser 30 in the row direction (−X direction). Further, a slope portion RP4 is formed by relatively moving the dispenser 30 in an obliquely upper direction therefrom.

Then, the dispenser 30 is relatively moved in the row direction (−X direction) to form the lower coupling portion 55b of the lower seal portion 54 in the counter substrate forming area 20 positioned at the right end. The returning stroke starts from the lower coupling portion 55b. In the returning stroke, first, a right side slope portion 62a is formed by relatively moving the dispenser 30 in an obliquely downward direction so as to continue to the lower coupling portion 55b of the counter substrate forming area 20 positioned at the right end. Then, a right side portion 62b is formed by relatively moving the dispenser 30 in the row direction (−Y direction). Then, a chamfered portion 61b is formed at the vicinity of the lower end by relatively moving the dispenser 30 in an obliquely downward direction (about 45 degrees).

Then, the dispenser is relatively moved in the row direction (−X direction) to form a lower side portion 59b. Then, when the dispenser 30 is reached at the vicinity of a left side portion 57b, the dispenser 30 is relatively moved in an obliquely upward direction (about 45 degrees) to from a chamfered portion 58b. Then, the dispenser 30 is raised in the column direction (+Y direction) to form the left side portion 57 facing the right side portion 60b.

Then, the dispenser 30 is relatively moved in an obliquely upward direction to form a left side slope portion 56b facing the right side slope portion 62b. Then, the dispenser 30 is relatively moved in the row direction (−X direction) at the vicinity of the center of the seal material 52 in the column direction (Y direction) to form the lower coupling portion 55b at the position near the upper coupling portion 55a of the upper seal portion 53.

Figure 6A:
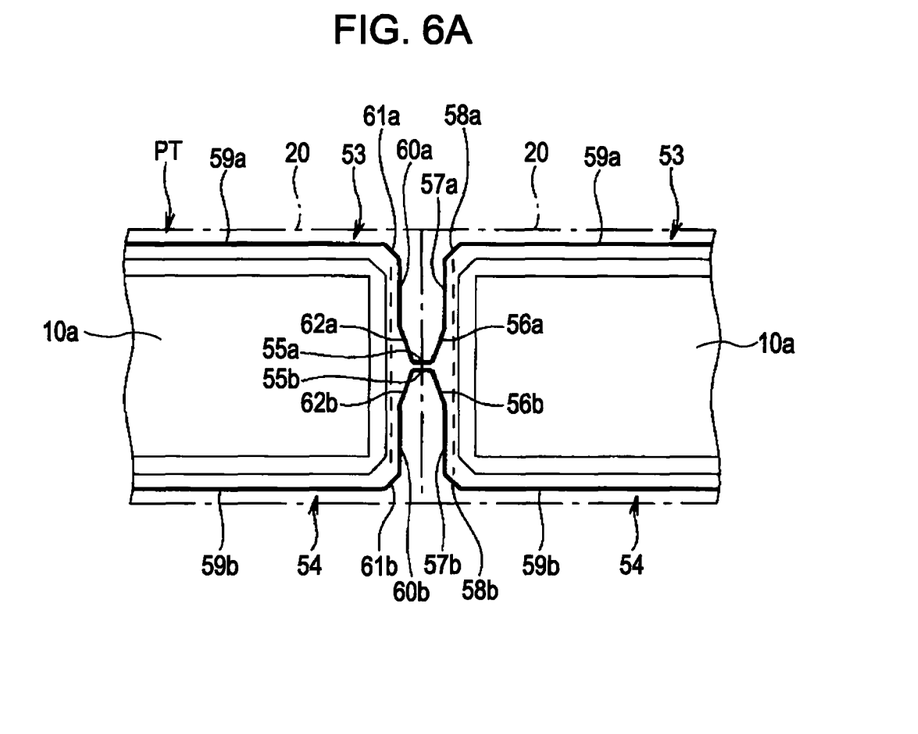
FIG. 6A is a plan view showing a drawing pattern before bonding and FIG. 6B is a plan view showing a state of the drawing pattern after bonding in the first embodiment.

Then, the dispenser 30 is relatively moved in the counter substrate forming area 20 adjacent to the left via the lower coupling portion 55b, and the lower seal portion 54 is continuously formed in the counter substrate forming area 20 by the operation of the dispenser 30 similar to the above described operation (see FIG. 6A).

By repeating the operation, the lower seal portion 54 is continuously formed in the counter substrate forming area 20 adjacent to the left. Then, when the formation of the lower seal portion 54 with respect to the counter substrate forming area 20 positioned at the left end is finished, the drawing end point EP is formed by extending the lower coupling portion 55b without change and the drawing of the seal material from the nozzle of the dispenser 30 is stopped.

Figure 3:
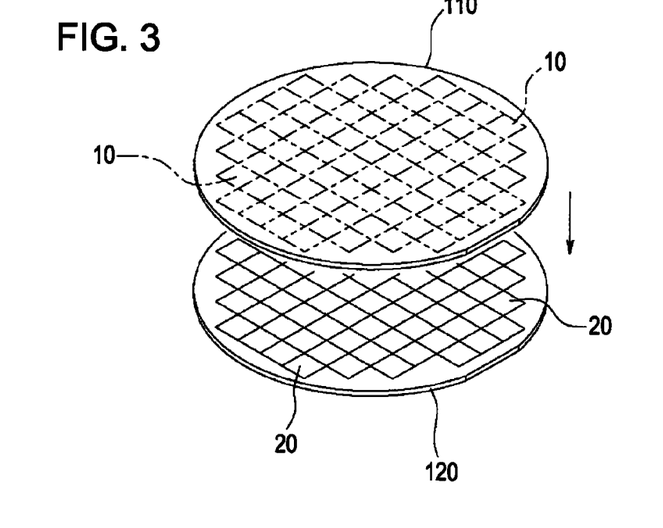
FIG. 3 is a perspective view showing the state where large size substrates are bonded together in the first embodiment.

Then, the seal material 52 is formed by a continuous drawing pattern PT with the same procedure as the above procedure with respect to the plurality of counter substrate forming areas 20 formed in the next row of the first large size substrate 120. Then, liquid crystal 50 is dropped on each of the counter substrate forming areas 20 surrounded by the seal material 52 after the formation of the seal material 52 is completed to the plurality of counter substrate forming areas 20 formed in all of the rows. Further, as shown in FIG. 3, the first large size substrate 120 and the second large size substrate 110 on which a plurality of TFT substrate forming areas 10 are formed are bonded together in a reduced pressure state (large substrates bonding process).

Figure 6B:
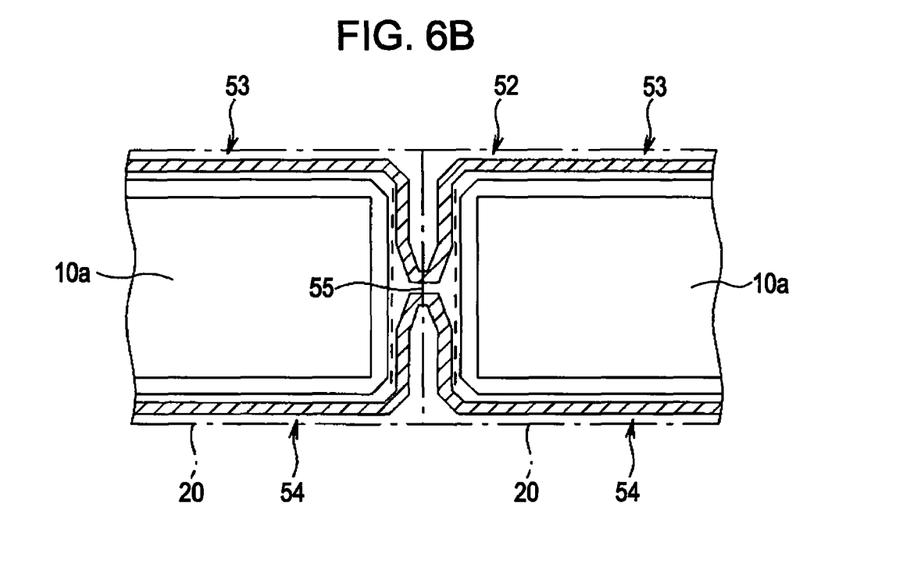

When the large substrates 110, 120 are bonded together, as shown in FIG. 6B, the drawn drawing pattern PT is squashed to be widened in the width direction, and the upper coupling portion 55a formed in the going stroke and the lower coupling portion 55b formed in the returning stroke are united and the closed seal material 52 is formed. Further, the area continuing to the upper and lower coupling portions 55a, 55b, that is, the area in which drawing direction is reversed and in which drawing interval is narrow shall be the slope portions 56a, 56b, 62a, 62b, so that when the both large size substrates 110, 120 are bonded together, the distance to the viewing area from the slope portions 56a, 56b, 62a, 62b can be lengthened. Accordingly, even when relatively large amount of the seal material is served at the vicinity of the corners of the both ends of the upper and lower coupling portions 55a, 55b, the broadening of the seal material into the viewing area can be restrained, and the invasion of the seal material into the viewing area can be prevented. Further, when drawing the seal material with respect to the last counter substrate forming area 20, the return point RP extending outside from the counter substrate forming area 20 is provided in the area in which drawing is switched from the going stroke to the returning stroke. Accordingly, when the both large size substrates 110, 120 are bonded together, it is prevented that the seal material is entered into the viewing area even when the seal material of the return point RP is squashed to be widened.

Further, as the drawing pattern PT is continuously formed from the going stroke to the returning stroke, shortening of the drawing takt time can be provided when drawing the drawing pattern PT. Further, setup time required for setting drawing conditions becomes approximately constant, so that drastic improvement of the operational efficiency can be provided. Further, there is only one drawing start point SP and one drawing end point EP when drawing the drawing pattern PT for one row, so that ejection error of the seal material caused by influence of air bubble mixed in the seal material or the like hardly occurs, the drawing error is reduced, and productivity of the product is improved.

Then, after the both large size substrates 110, 120 are bonded together in place, the seal material 52 is cured. Then, the bonded large size substrates 110, 120 is cut for every unit of the liquid crystal device (substrate cutting process).

Note that, in the embodiment, the drawing pattern PT is drawn at the first large size substrate 120 side at which the plurality of counter substrate forming areas 20 are formed. However, the drawing pattern PT may be drawn at the second large size substrate 110 side at which the pluralities of TFT substrate forming areas 10 are formed.

Second Embodiment

Figure 8:
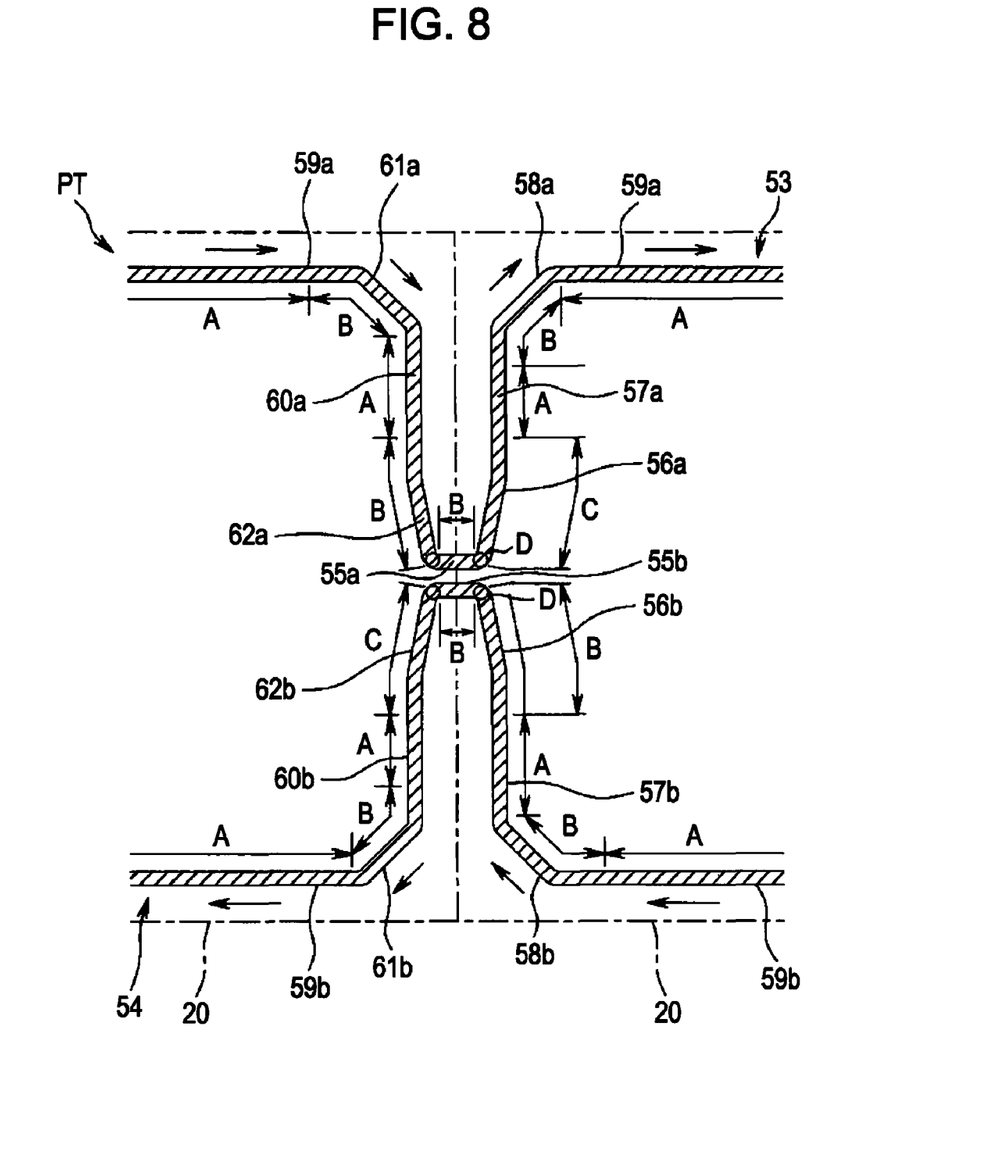
FIG. 8 is a main part enlarged view of a drawing pattern according to a second embodiment.

A main portion enlarged view of the drawing pattern according to a second embodiment of the invention is shown in FIG. 8. In the embodiment, the relative speed is to be changed for every area when drawing the drawing pattern PT. A fixed amount of the seal material is ejected from the dispenser 30. However, in particular when the drawing is performed by the same relative speed as that in the straight portions in the corner portions, the cross sectional area of the seal material is reduce. This easily causes interruption of the seal material.

Accordingly, in the embodiment, the application amount of the entire drawing pattern PT is to be set to become approximately an even amount by setting the relative speed slow in the area in which the seal material is easily interrupted and the relative speed fast in the area in which the seal material is hardly interrupted.

As shown in FIG. 8, the drawing relative moving speed is set so as to satisfy A>B>C>D. That is, in the drawing pattern PT of the upper seal portion 53, the upper side portion 59a is drawn by the fastest speed A to just front of the chamfered portion 61a, and then, drawing is performed by the speed B therefrom to the end of the chamfered portion 58b, and the right side portion 60a is drawn by the speed A again to just front of the right side slope portion 62a. Further, the right side slope portion 62a is drawn by the speed B therefrom, and the corner portion reaching the upper coupling portion 55a is drawn by the slowest speed D.

Then, the upper coupling portion 55a is drawn by the speed B, and the corner portion continuing to the slope potion 56a of the counter substrate forming area 20 adjacent to the right is drawn by the slowest speed D. Then, the drawing is performed at the speed C from the slope portion 56a to a halfway of the left side portion 57a, the drawing is performed by the fastest speed A therefrom to just front of the chamfered portion 58a of the left side portion 57a, the drawing is preformed by the speed B therefrom to the chamfered portion 58a, and the upper side portion 59a is drawn by the fastest speed A.

On the other hand, when drawing the drawing pattern PT for the lower seal portion 54, the lower side portion 59 is drawn by the fastest speed A to just front of the chamfered portion 58b, and the drawing is performed by the speed B therefrom to the end of the chamfered portion 58b, and the left side portion 57b is drawn by the speed A again to just front of the slope portion 56b. Then, the slope portion 56b is drawn by the speed B therefrom, and the corner just front of the lower coupling portion 55b is drawn by the slowest speed D.

Then, the lower coupling portion 55b is drawn by the speed B, the corner continuing to the slope portion 62b of the counter substrate forming area 20 adjacent to the left is drawn by the slowest speed D, and then, the drawing is performed by the speed C from the slope portion 62a to a halfway of the right side portion 60. Then, drawing is performed by the fastest speed A therefrom to just front of the chamfered portion 61b of the right side portion 60b, the drawing is preformed by the speed B therefrom to the chamfered portion 61b, and the lower side portion 59b is drawn by the fastest speed A.

In this manner, in the embodiment, the relative moving speed in each area is to be changed in accordance with the application condition of the seal material, so that the application amount of the seal material becomes even, and stable drawing can be performed.

Third Embodiment

Figure 9:
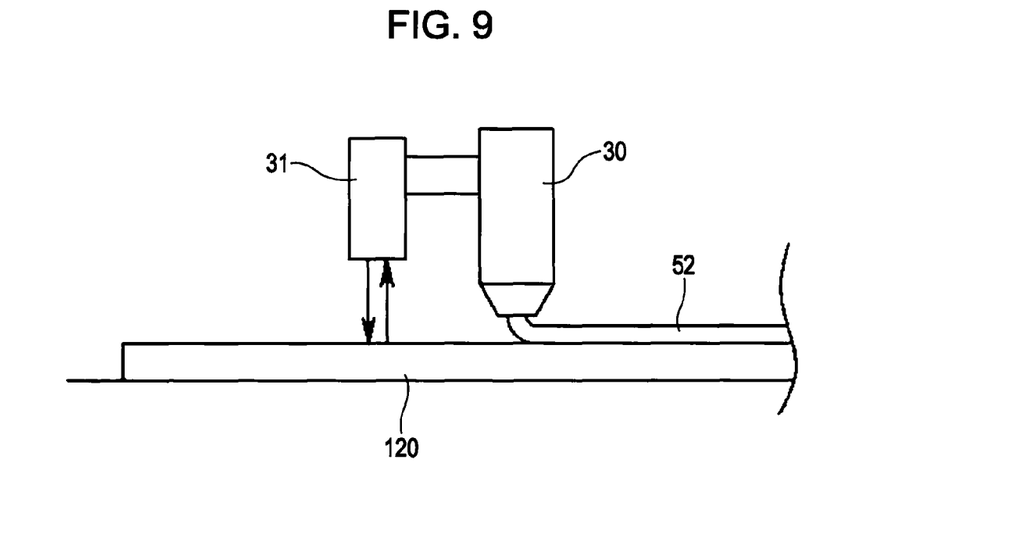
FIG. 9 is a diagram illustrating a state where a seal material is drawn on the large size substrate according to a third embodiment.
Figure 10:
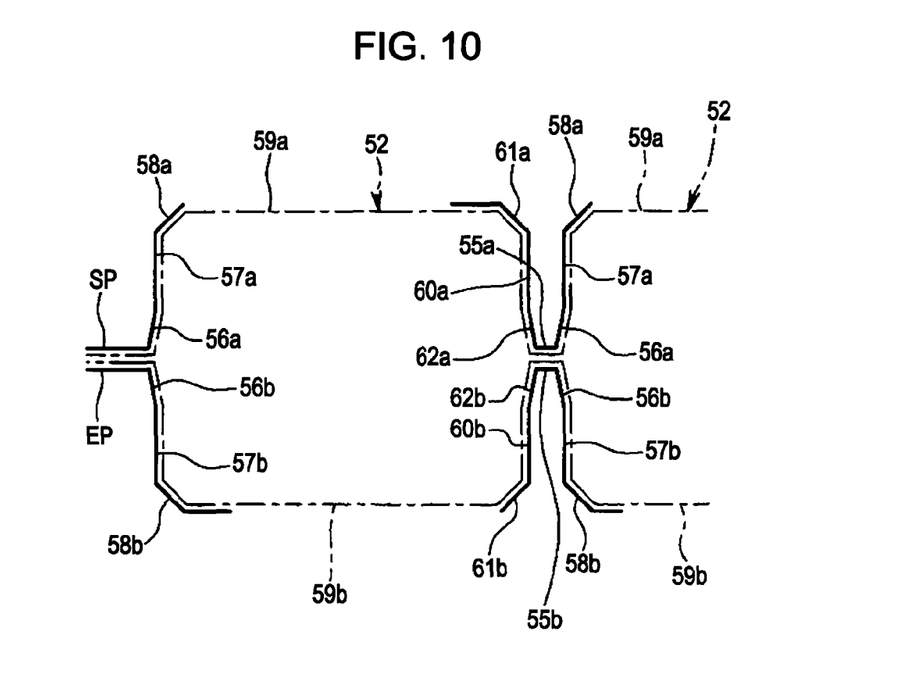
FIG. 10 is a diagram illustrating a drawing pattern according to the third embodiment.

A third embodiment of the invention is shown in FIGS. 9 and 10. As shown in FIG. 9, when moving the dispenser 30 along the first large size substrate 120, the distance between the first large size substrate 120 and the nozzle end of the dispenser 30 is measured by a non contact type displacement gauge 31 using a laser or the like, and the dispenser 30 and the first large size substrate 120 are relatively moved while controlling the distance so as to be kept at a constant value.

However, in the area in which relative moving direction is drastically changed, vibration generates for each time the traveling direction is switched. The error of the value measured by the non contact type displacement gauge 31 becomes large by the vibration, thereby deteriorating the measurement accuracy.

Accordingly, in the embodiment, as shown in FIG. 10, in the areas except the upper side portion 59a and lower side portion 59b, in which the proceeding direction is largely changed, no signal is to be read out from the non contact type displacement gauge 31 and drawing is to be performed in the state where the distance between the first large size substrate 120 and the end of the nozzle of the dispenser 30 is fixed. As a result, stable drawing can be performed even when vibration is generated in the area in which proceeding direction is drastically changed.

The electro optical device of the invention may be a passive matrix type liquid crystal device or a liquid crystal device equipped with a TFD (Thin Film Diode) as a switching element beside a TFT active matrix driving type liquid crystal device. Further, besides the liquid crystal device, the present invention can be applicable to various electro optical devices such as an electro luminescent device, an organic electro luminescent device, a plasma display device, an electrophoretic display device, a device using an electron emission element (Field Emission Display and Surface-Conduction Electron-Emitter Display), a DLP (Digital Light Processing), a DMD (Digital Micromirror Device), and the like.

What is claimed is:

1. A manufacturing method of an electro optical device, comprising:
    drawing a seal material in adjacent substrate forming areas on a first large size substrate, each of the substrate forming areas having a rectangular boundary; and
    bonding a second large size substrate to the first large size substrate via the seal material, wherein
    during drawing of the seal material, the seal material is continuously drawn in the substrate forming areas by:
        a going stroke by which the seal material is continuously drawn through a portion of each of the substrate forming areas from a leftmost substrate forming area to a rightmost substrate forming area, the going stroke including a plurality of chamfered portions disposed near corners of the substrate forming areas, the going stroke including a right side portion disposed inside the rectangular boundary of the rightmost substrate forming area adjacent to a right side of the rectangular boundary of the rightmost substrate forming area;
        a return point at the end of the going stroke, the return point including:
            a first return point portion extending in a rightward direction across the right side of the rectangular boundary of the rightmost substrate forming area to a region outside of the rectangular boundary of the rightmost substrate forming area,
            a second return point portion extending from the first return point portion in a direction substantially perpendicular to the first return point portion,
            a third return point portion extending in a leftward direction from the second return point portion,
            a fourth return point portion extending obliquely from the third return point portion toward the first return point portion; and
        a returning stroke by which the seal material is continuously drawn from the return point and through a different portion of each of the substrate forming areas, the returning stroke including a lower coupling portion extending from the fourth return point portion in a leftward direction across the right side of the rectangular boundary of the rightmost substrate forming area.

2. The manufacturing method of an electro optical device according to claim 1, wherein during drawing of the seal material, a drawing start point and a drawing end point of the seal material are positioned at a first side of the plurality of substrate forming areas and the return point is positioned at a second side facing the first side.

3. The manufacturing method of an electro optical device according to claim 2, wherein during drawing of the seal material, the drawing start point and the drawing end point of the seal material are provided at adjacent positions.

4. The manufacturing method of an electro optical device according to claim 1, wherein during drawing of the seal material, a drawing speed at a corner portion is set slower than a drawing speed at a straight portion.

5. The manufacturing method of an electro optical device according to claim 1, wherein during drawing of the seal material, a distance between the adjacent seal material drawn in one of the substrate forming areas and another one of the substrate forming areas adjacent to the one of the substrate forming areas is narrowly set.

* * * * *